(12) United States Patent
Degawa et al.

(10) Patent No.: US 10,439,592 B2
(45) Date of Patent: Oct. 8, 2019

(54) MAGNETORESISTANCE EFFECT DEVICE AND HIGH FREQUENCY DEVICE

(71) Applicant: TDK CORPORATION, Tokyo (JP)

(72) Inventors: Naomichi Degawa, Tokyo (JP); Takekazu Yamane, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/048,034

(22) Filed: Jul. 27, 2018

(65) Prior Publication Data

US 2019/0044500 A1 Feb. 7, 2019

(30) Foreign Application Priority Data

Aug. 7, 2017 (JP) .................................. 2017-152725

(51) Int. Cl.
| | |
|---|---|
| *H03H 11/04* | (2006.01) |
| *H01F 10/32* | (2006.01) |
| *H03F 15/00* | (2006.01) |
| *H03H 2/00* | (2006.01) |
| *H03H 11/16* | (2006.01) |

(52) U.S. Cl.
CPC ........... *H03H 11/04* (2013.01); *H01F 10/329* (2013.01); *H03F 15/00* (2013.01); *H03H 2/00* (2013.01); *H01F 10/3286* (2013.01); *H03H 11/16* (2013.01)

(58) Field of Classification Search
None
See application file for complete search history.

(56) References Cited

U.S. PATENT DOCUMENTS

| | | | | |
|---|---|---|---|---|
| 6,245,450 | B1 * | 6/2001 | Kawawake | B82Y 10/00 204/192.2 |
| 6,943,041 | B2 * | 9/2005 | Sugita | B82Y 10/00 257/E27.005 |
| 9,425,738 | B2 * | 8/2016 | Wang | H03B 15/006 |
| 9,906,199 | B2 * | 2/2018 | Shibata | H03H 2/00 |

(Continued)

FOREIGN PATENT DOCUMENTS

WO 2011/033664 A1 3/2011

OTHER PUBLICATIONS

Beaujour et al., "Ferromagnetic resonance study of polycrystalline cobalt ultrathin films," Journal of Applied Physics, 2006, vol. 99, 08N503-1-08N503-3.

*Primary Examiner* — Cassandra F Cox
(74) *Attorney, Agent, or Firm* — Oliff PLC

(57) ABSTRACT

A magnetoresistance effect device includes a magnetoresistance effect element including a magnetization fixed layer, a magnetization free layer of which a direction of magnetization is changeable relative to a direction of magnetization of the fixed layer, and a spacer layer sandwiched between the fixed and free layers, a first signal line configured to generate a high frequency magnetic field when a high frequency current flows and apply the field to the magnetization free layer, and a DC application terminal configured to be capable of connecting a power supply for applying a DC current or voltage in a stacking direction of the element, and the element is disposed with respect to the terminal so the DC current flows from the fixed layer to the free layer in the element or so the DC voltage at which the magnetization fixed layer is higher in potential than the magnetization free layer is applied.

10 Claims, 11 Drawing Sheets

(56) References Cited

U.S. PATENT DOCUMENTS

| | | | |
|---|---|---|---|
| 2011/0038198 A1* | 2/2011 | Kent | H01F 10/193 365/158 |
| 2015/0179198 A1* | 6/2015 | Ong | G11B 5/596 360/31 |
| 2017/0244377 A1 | 8/2017 | Yamane et al. | |
| 2017/0345449 A1* | 11/2017 | Shibata | G11B 5/3945 |

* cited by examiner

MAGNETORESISTANCE EFFECT DEVICE AND HIGH FREQUENCY DEVICE

BACKGROUND

The disclosure relates to a magnetoresistance effect device and a high frequency device.

Priority is claimed on Japanese Patent Application No. 2017-152725, filed Aug. 7, 2017, the content of which is incorporated herein by reference.

In recent years, as mobile communication terminals such as cellular phones have become more sophisticated, the speed of wireless communication has increased. Since the communication speed is proportional to a bandwidth of a frequency to be used, a frequency band required for communication is becoming larger. In addition, the required number of high frequency filters mounted on mobile communication terminals is also increasing.

Further, in recent years, spintronics has been studied as a field likely to be applied to new high frequency parts. One of phenomena attracting attention in the field is a ferromagnetic resonance phenomenon due to a magnetoresistance effect element (see Non-Patent Document, J.-M. L. Beaujour, et al., JOURNAL OF APPLIED PHYSICS 99, 08N503 (2006).)

When an alternating magnetic field is applied to a ferromagnetic layer included in a magnetoresistance effect element, the alternating magnetic field can be caused ferromagnetic resonance at magnetization of the ferromagnetic layer. When ferromagnetic resonance occurs, a resistance value of the magnetoresistance effect element oscillates periodically at a ferromagnetic resonance frequency. The ferromagnetic resonance frequency changes according to the intensity of the magnetic field applied to the ferromagnetic layer. In general, the ferromagnetic resonance frequency is a high frequency band of several to several tens of GHz.

SUMMARY

As described above, investigation of high frequency oscillation elements using the ferromagnetic resonance phenomenon are progressing. However, specific investigation of other applications of the ferromagnetic resonance phenomenon is still insufficient.

It is desirable to provide a magnetoresistance effect device that functions as a high frequency device such as a high frequency filter using a ferromagnetic resonance phenomenon.

In order to solve the above problem, a method of using a magnetoresistance effect device using a ferromagnetic resonance phenomenon as a high frequency device has been studied. As a result, a magnetoresistance effect device using a change in a resistance value of a magnetoresistance effect element caused by a ferromagnetic resonance phenomenon has been found, and it has been found that this magnetoresistance effect device functions as a high frequency device.

Further, in order to improve output characteristics of the high frequency device, it has been found that a direction in which a DC current or a DC voltage is applied to the magnetoresistance effect element is important, and configuration for a magnetoresistance effect device having excellent output characteristics has been found.

That is, the present disclosure provides the following means to solve the above problem.

(1) A magnetoresistance effect device according to a first aspect includes at least one magnetoresistance effect element including a magnetization fixed layer, a magnetization free layer of which a direction of magnetization is changeable relative to a direction of magnetization of the magnetization fixed layer, and a spacer layer sandwiched between the magnetization fixed layer and the magnetization free layer; a first signal line that is configured to generate a high frequency magnetic field when a high frequency current flows and apply the high frequency magnetic field to the magnetization free layer; and a DC application terminal that is configured to be capable of connecting a power supply for applying a DC current or a DC voltage in a stacking direction of the magnetoresistance effect element, wherein the magnetoresistance effect element is disposed with respect to the DC application terminal such that the DC current flows from the magnetization fixed layer to the magnetization free layer in the magnetoresistance effect element or such that the DC voltage at which the magnetization fixed layer is higher in potential than the magnetization free layer is applied.

DETAILED DESCRIPTION

Figure 1:
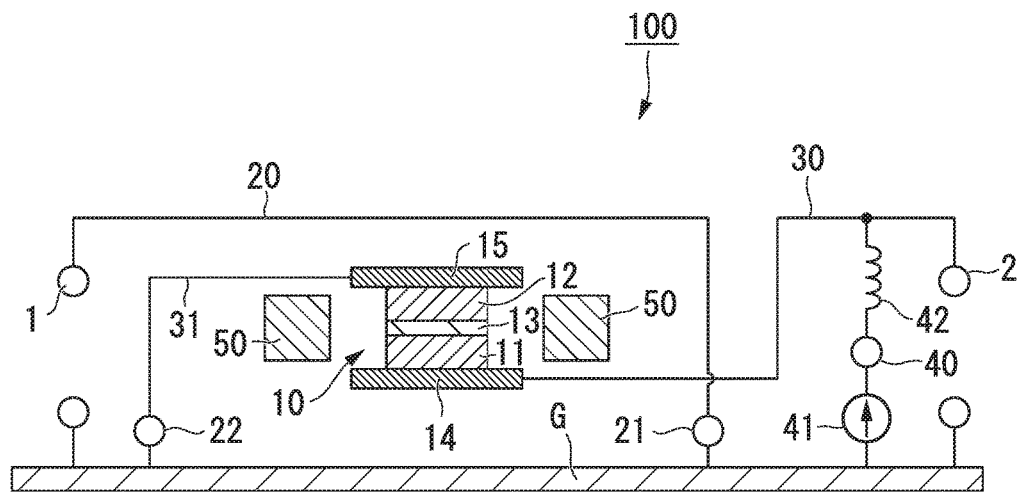
FIG. 1 is a schematic diagram showing a circuit configuration of a magnetoresistance effect device according to a first embodiment.

Hereinafter, a magnetoresistance effect device will be described in detail with reference to the drawings as appropriate. In the drawings used in the following description, parts that are features of the magnetoresistance effect device may be enlarged and shown for the sake of clarity of the features for convenience, and dimensional proportions of respective components and the like may differ from those of actual dimensional proportions. Materials, dimensions, and the like shown in the following description are examples, the present invention is not limited thereto, and the present invention may be realized by appropriately changing the materials, the dimensions, and the like within a range in which the effects of the present disclosure are achieved.

First Embodiment

FIG. 1 is a schematic diagram showing a circuit configuration of a magnetoresistance effect device according to a first embodiment of the present disclosure. The magnetoresistance effect device 100 shown in FIG. 1 includes a magnetoresistance effect element 10, a first signal line 20, and a DC application terminal 40. The magnetoresistance effect device 100 receives a signal from a first port 1 and outputs a signal from a second port 2. The signal to be output can be changed by a frequency setting apparatus 50.

<First Port and Second Port>

The first port 1 is an input terminal of the magnetoresistance effect device 100. The first port 1 corresponds to one end of the first signal line 20. An AC signal source (not shown) is connected to the first port 1, and an AC signal (a high frequency signal) can be applied to the magnetoresistance effect device 100. The high frequency signal applied to the magnetoresistance effect device 100 is, for example, a signal having a frequency of 100 MHz or more.

The second port 2 is an output terminal of the magnetoresistance effect device 100. The second port 2 corresponds to one end of an output signal line (a second signal line) 30 for transferring a signal to be output from the magnetoresistance effect element 10. A high frequency measurement instrument (not shown) is connected to the second port 2 so that the high frequency measurement instrument can measure the signal to be output from the magnetoresistance effect device 100. For the high frequency measurement instrument, for example, a network analyzer or the like can be used.

<Magnetoresistance Effect Element>

The magnetoresistance effect element 10 includes a magnetization fixed layer 11, a magnetization free layer 12, and a spacer layer 13. The spacer layer 13 is located between the magnetization fixed layer 11 and the magnetization free layer 12. It is more difficult for magnetization of the magnetization fixed layer 11 to move in comparison with magnetization of the magnetization free layer 12 and it is fixed in one direction under a predetermined magnetic field environment. A direction of the magnetization of the magnetization free layer 12 is changed relative to the direction of the magnetization of the magnetization fixed layer 11 to achieve a function of the magnetoresistance effect element 10.

The magnetization fixed layer 11 is formed of a ferromagnetic material. It is preferable for the magnetization fixed layer 11 to be formed of a material having a high spin polarizability, such as Fe, Co, Ni, an alloy of Ni and Fe, an alloy of Fe and Co, or an alloy of Fe and Co and B. Using such a material, a change rate of magnetoresistance of the magnetoresistance effect element 10 is increased. Further, the magnetization fixed layer 11 may be formed of a Heusler alloy. It is preferable for a thickness of the magnetization fixed layer 11 to be 1 to 10 nm.

A method of fixing the magnetization of the magnetization fixed layer 11 is not particularly limited. For example, an antiferromagnetic layer may be added to come into contact with the magnetization fixed layer 11 to fix the magnetization of the magnetization fixed layer 11. Further, the magnetization of the magnetization fixed layer 11 may be fixed using the magnetic anisotropy caused by a crystal structure, a form, or the like.

For the antiferromagnetic layer, FeO, CoO, NiO, $CuFeS_2$, IrMn, FeMn, PtMn, Cr, Mn, or the like can be used.

The magnetization free layer 12 is formed of a ferromagnetic material of which a direction of magnetization thereof is changeable by an externally applied magnetic field or spin polarized currents.

CoFe, CoFeB, CoFeSi, CoMnGe, CoMnSi, or CoMnAl can be used as a material thereof when the magnetization free layer 12 has an axis of easy magnetization in an in-plane direction perpendicular to a stacking direction in which the magnetization free layer 12 is stacked. Co, a CoCr-based alloy, a Co multilayer film, a CoCrPt-based alloy, an FePt-based alloy, a SmCo-based alloy containing rare earth elements, or a TbFeCo alloy can be used as a material when the magnetization free layer 12 has the axis of easy magnetization in the stacking direction in which the magnetization free layer 12 is stacked. Further, the magnetization free layer 12 may also be formed of a Heusler alloy.

A thickness of the magnetization free layer 12 is preferably about 1 to 10 nm. Further, a high spin polarizability material may be inserted between the magnetization free layer 12 and the spacer layer 13. By inserting a high spin polarizability material, it is possible to obtain a high change rate of magnetoresistance.

Examples of the high spin polarization material include a CoFe alloy and a CoFeB alloy.

A thickness of the CoFe alloy or CoFeB alloy is preferably about 0.2 to 1.0 nm.

The spacer layer 13 is a nonmagnetic layer that is disposed between the magnetization fixed layer 11 and the magnetization free layer 12. The spacer layer 13 may be a layer formed of a conductor, an insulator, or a semiconductor, or a layer having a conduction point which is formed of conductor in an insulator.

For example, when the spacer layer 13 is formed of an insulator, the magnetoresistance effect element 10 becomes a tunneling magnetoresistance (TMR) element, and when the spacer layer 13 is formed of a metal, the magnetoresistance effect element 10 becomes a giant magnetoresistance (GMR) element.

When the spacer layer 13 is formed of a nonmagnetic conductive material, a conductive material such as Cu, Ag, Au, or Ru can be used. In order to use a GMR effect efficiently, a thickness of the spacer layer 13 is preferably about 0.5 to 3.0 nm.

When the spacer layer 13 is formed of a nonmagnetic semiconductor material, a material such as ZnO, $In_2O_3$, $SnO_2$, ITO, $GaO_x$ or $Ga_2O_x$ can be used. In this case, a thickness of the spacer layer 13 is preferably about 1.0 to 4.0 nm.

When a layer including a conduction point formed of a conductor in a nonmagnetic insulator is applied as the spacer layer 13, it is preferable to adopt a structure including a conduction point formed of a conductor such as CoFe, CoFeB, CoFeSi, CoMnGe, CoMnSi, CoMnAl, Fe, Co, Au, Cu, Al, or Mg in a nonmagnetic insulator formed of $Al_2O_3$ or MgO. In this case, the thickness of the spacer layer 13 is preferably about 0.5 to 2.0 nm.

It is preferable for electrodes to be provided on both surfaces of the magnetoresistance effect element 10 in the stacking direction in order to increase conduction to the magnetoresistance effect element 10. Hereinafter, an electrode provided in a lower part in the stacking direction of the magnetoresistance effect element 10 is referred to as a lower electrode 14, and an electrode provided in an upper part is referred to as an upper electrode 15. By providing the lower electrode 14 and the upper electrode 15, an output signal line 30 and a line 31, and the magnetoresistance effect element 10 come into contact with each other on a plane, and a flow of a signal (current) is in the stacking direction irrespective of a position in the in-plane direction of the magnetoresistance effect element 10.

The lower electrode 14 and the upper electrode 15 are formed of a conductive material. For example, Ta, Cu, Au, AuCu, Ru, or Al can be used for the lower electrode 14 and the upper electrode 15.

Further, a cap layer, a seed layer, or a buffer layer may be disposed between the magnetoresistance effect element 10 and the lower electrode 14 or the upper electrode 15. Examples of the cap layer, the seed layer, or the buffer layer include Ru, Ta, Cu, Cr, and stacked films thereof. The thickness of each of such layers is preferably about 2 to 10 nm.

It is preferable for a size of the magnetoresistance effect element 10 to be 300 nm or less in a long side when a shape in a plan view of the magnetoresistance effect element 10 is a rectangle (including a square). When the shape in a plan view of the magnetoresistance effect element 10 is not a rectangle, the long side of a rectangle circumscribing with a minimum area the shape in a plan view of the magnetoresistance effect element 10 is defined as the long side of the magnetoresistance effect element 10.

When the long side becomes as small as about 300 nm, a volume of the magnetization free layer 12 becomes small, and a highly efficient ferromagnetic resonance phenomenon can be realized. Here, the "shape in a plan view" is a shape as seen in the stacking direction of respective layers constituting the magnetoresistance effect element 10.

<First Signal Line>

Figure 2:
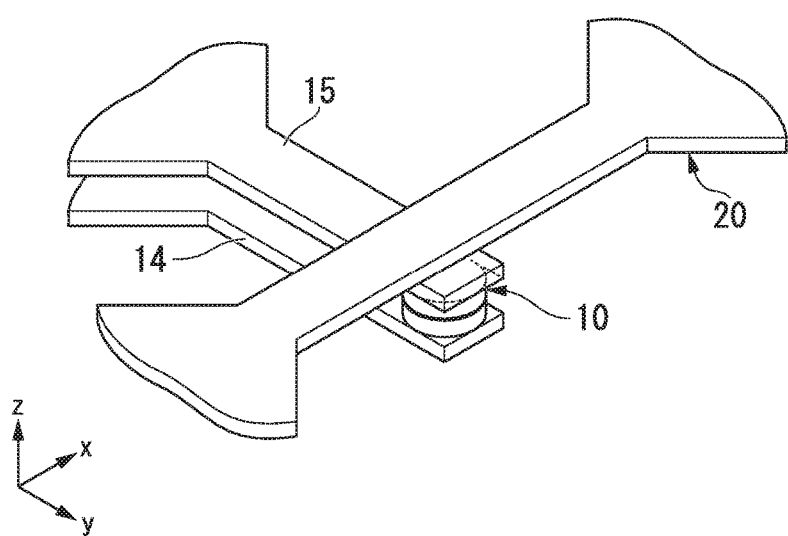
FIG. 2 is an enlarged perspective view of the vicinity of a magnetoresistance effect element of the magnetoresistance effect device shown in FIG. 1.

The first signal line 20 in FIG. 1 has one end connected to the first port 1. Further, the other end of the first signal line 20 is connected to a reference potential via a reference potential terminal 21 when the magnetoresistance effect device 100 is used. In FIG. 1, the other end of the first signal line 20 is connected to a ground G as a reference potential. The ground G can be external to the magnetoresistance effect device 100. A high frequency current flows in the first signal line 20 according to a potential difference between the high frequency signal input to the first port 1 and the ground G FIG. 2 is an enlarged perspective view of the vicinity of the magnetoresistance effect element 10 of the magnetoresistance effect device 100 shown in FIG. 1. When the high frequency current flows in the first signal line 20, a high frequency magnetic field is generated from the first signal line 20. This high frequency magnetic field is applied to the magnetization free layer 12 of the magnetoresistance effect element 10.

The first signal line 20 is not limited to one single signal line and may be a plurality of signal lines. In this case, it is preferable for a plurality of signal lines to be disposed at a position at which the high frequency magnetic field generated from each signal line is strengthened at the position of the magnetoresistance effect element 10.

<Output Signal Line, and Line>

The output signal line 30 propagates a signal output from the magnetoresistance effect element 10. The signal output from the magnetoresistance effect element 10 is a signal at a frequency selected using the ferromagnetic resonance of the magnetization free layer 12. The output signal line 30 shown in FIG. 1 has one end connected to the magnetoresistance effect element 10 and the other end connected to the second port 2. That is, the output signal line 30 shown in FIG. 1 connects the magnetoresistance effect element 10 to the second port 2.

Further, a capacitor may be provided in the output signal line 30 between a part constituting the closed circuit formed of the power supply 41, the output signal line 30, the magnetoresistance effect element 10, the line 31, and the ground G and the second port 2 (as an example, the output signal line 30 between a point at which the inductor 42 is connected to the output signal line 30 and the second port 2). By providing the capacitor in such a part, it is possible to prevent an invariant component of a current from being added to the output signal output from the second port 2.

One end of the line 31 is connected to the magnetoresistance effect element 10. Further, the other end of the line 31 is connected to the reference potential via the reference potential terminal 22 when the magnetoresistance effect device 100 is used. Although the line 31 is connected to the same ground G as the reference potential of the first signal line 20 in FIG. 1, the line 31 may be connected to another reference potential. In order to simplify a circuit configuration, it is preferable for the reference potential of the first signal line 20 to be the same as the reference potential of the line 31.

It is preferable for the form of each line and the ground G to be defined as a microstrip line (MSL) type or a coplanar waveguide (CPW) type. When the form of each line is designed by the microstrip line (MSL) type or the coplanar waveguide (CPW) typ, it is preferable to design a line width and a ground-to-ground distance so that a characteristic impedance of the line becomes equal to an impedance of a circuit system. Due to this design, it is possible to prevent a transmission loss in the line.

<DC Application Terminal>

The DC application terminal 40 is connected to the power supply 41 and applies a DC current or a DC voltage in the stacking direction of the magnetoresistance effect element 10. In the present specification, the DC current is a current of which a direction does not change with time, and includes a current of which a magnitude changes with time. Further, the DC voltage is a voltage of which a polarity does not change with time and also includes a voltage of which a magnitude changes with time. The power supply 41 may be either a DC current source or a DC voltage source. The power supply 41 may be a DC current source capable of generating a constant DC current or may be a DC voltage source capable of generating a constant DC voltage. Further, the power supply 41 may be a DC current source in which a magnitude of a generated DC current value can be changed or may be a DC voltage source of which a magnitude of a generated DC voltage value can be changed. It is preferable for a current density of the current applied to the magnetoresistance effect element 10 to be lower than an oscillation threshold value current density of the magnetoresistance effect element 10. The oscillation threshold value current density of the magnetoresistance effect element 10 refers to a current density of a threshold value at which the magnetoresistance effect element 10 oscillates (the output (resistance value) of the magnetoresistance effect element 10 changes at a constant frequency and with a constant amplitude) as the magnetization of the magnetization free layer 12 of the magnetoresistance effect element 10 starts precession at a constant frequency and with a constant amplitude due to application of a current having a current density equal to or greater than the value.

The inductor 42 is disposed between the DC application terminal 40 and the output signal line 30.

The inductor 42 cuts off a high frequency component of the current and passes an invariant component of the current. The output signal output from the magnetoresistance effect element 10 efficiently flows to the second port 2 due to the inductor 42. The invariant component of the current flows into a closed circuit formed of the power supply 41, the output signal line 30, the magnetoresistance effect element 10, the line 31, and the ground G due to the inductor 42.

For the inductor 42, a chip inductor, an inductor based on a patterned line, a resistive element having an inductor component, or the like can be used. An inductance of the inductor 42 is preferably 10 nH or more.

When the power supply 41 is a DC current source, the power supply 41 is connected to the DC application terminal 40 so that the DC current flows into the magnetoresistance effect element 10 from the magnetization fixed layer 11 to the magnetization free layer 12. That is, the magnetoresistance effect element 10 is disposed with respect to the DC application terminal 40 so that the DC current applied from the DC application terminal 40 flows from the magnetization fixed layer 11 to the magnetization free layer 12 in the magnetoresistance effect element 10.

When the power supply 41 is a DC voltage source, the power supply 41 is connected to the DC application terminal 40 so that the DC voltage at which the magnetization fixed layer 11 reaches at a higher potential than that of the magnetization free layer 12. The DC voltage is applied from the DC application terminal 40. That is, the magnetoresistance effect element 10 is disposed with respect to the DC application terminal 40 so that the DC voltage at which the magnetization fixed layer 11 reaches a higher potential than that of the magnetization free layer 12. The DC voltage is applied from the DC application terminal 40.

<Frequency Setting Apparatus>

The frequency setting apparatus 50 is a magnetic field application apparatus that applies an external magnetic field, which is a static magnetic field, to the magnetoresistance effect element 10, and sets a ferromagnetic resonance frequency of the magnetization free layer 12 of the magnetoresistance effect element 10. The frequency of the signal output from the magnetoresistance effect device 100 is changed according to the ferromagnetic resonance frequency of the magnetization free layer 12. Therefore, the frequency of the output signal can be set by the frequency setting apparatus 50.

It is preferable for the frequency setting apparatus 50 to be disposed in the vicinity of the magnetoresistance effect element 10. The frequency setting apparatus 50 is configured as, for example, an electromagnet type or a strip line type of magnetic field application apparatus capable of variably controlling an applied magnetic field strength using either a voltage or a current. Further, the frequency setting apparatus 50 may be configured as a combination of an electromagnet type or strip line type of magnetic field application apparatus capable of variably controlling an applied magnetic field strength and a permanent magnet that supplies only a constant magnetic field.

<Function of Magnetoresistance Effect Device>

When a high frequency signal is input from the first port 1 to the magnetoresistance effect device 100, a high frequency current corresponding to the high frequency signal flows in the first signal line 20. A high frequency magnetic field generated by the high frequency current flowing in the first signal line 20 is applied to the magnetization free layer 12 of the magnetoresistance effect element 10.

The magnetization of the magnetization free layer 12 greatly oscillates when the frequency of the high frequency magnetic field applied to the magnetoresistance effect element 10 by the first signal line 20 is in the vicinity of the ferromagnetic resonance frequency of the magnetization free layer 12. This phenomenon is a ferromagnetic resonance phenomenon.

As the oscillation of the magnetization of the magnetization free layer 12 increases, the change in a resistance value in the magnetoresistance effect element 10 increases. For example, when a constant DC current is applied to the magnetoresistance effect element 10 from the DC application terminal 40, the change in the resistance value of the magnetoresistance effect element 10 is output from the second port 2 as a change in a potential difference between the lower electrode 14 and the upper electrode 15. Further, for example, when a constant DC voltage is applied to the magnetoresistance effect element 10 from the DC application terminal 40, the change in the resistance value of the magnetoresistance effect element 10 is output from the second port 2 as a change in a value of the current flowing between the lower electrode 14 and the upper electrode 15.

That is, when the frequency of the high frequency signal input from the first port 1 is in the vicinity of the ferromagnetic resonance frequency of the magnetization free layer 12, the amount of variation in the resistance value of the magnetoresistance effect element 10 is large, and a large signal is output from the second port 2. On the other hand, when the frequency of the high frequency signal is away from the ferromagnetic resonance frequency of the magnetization free layer 12, the amount of variation in the resistance value of the magnetoresistance effect element 10 is small and hardly any signal is output from the second port 2. That is, the magnetoresistance effect device 100 functions as a high frequency filter that can selectively pass a high frequency signal at a specific frequency.

Further, in order to increase a range of cutoff characteristics and pass characteristics of the high frequency filter, it is preferable for a configuration in which the axis of easy magnetization of the magnetization free layer 12 has a component in a direction of a film surface normal, and the magnetization fixed layer 11 has an axis of easy magnetization in a film surface direction to be adopted.

<Influence According to Direction of Application of DC Current or DC Voltage>

The change in the resistance value of the magnetoresistance effect element 10 is read by applying a DC current or a DC voltage to the magnetoresistance effect element 10. When a constant DC voltage is applied to the magnetoresistance effect element 10, a DC current of which the magnitude changes with time but the direction does not change flows into the magnetoresistance effect element 10 with the change in the resistance value of the magnetoresistance effect element 10. In either case in which the DC current or the DC voltage is applied to the magnetoresistance effect element 10, the direction of the DC current flowing in the magnetoresistance effect element 10 is a direction from the magnetization fixed layer 11 to the magnetization free layer 12. The inventors have found that, when a DC current flows in this direction, it is possible to stabilize oscillation of the magnetization of the magnetization free layer 12 oscillating due to the high frequency magnetic field, and as a result, it is possible to reduce noise in the signal output from the magnetoresistance effect device 100.

The reasoning behind this thinking of the inventors will be specifically described.

Figure 3:
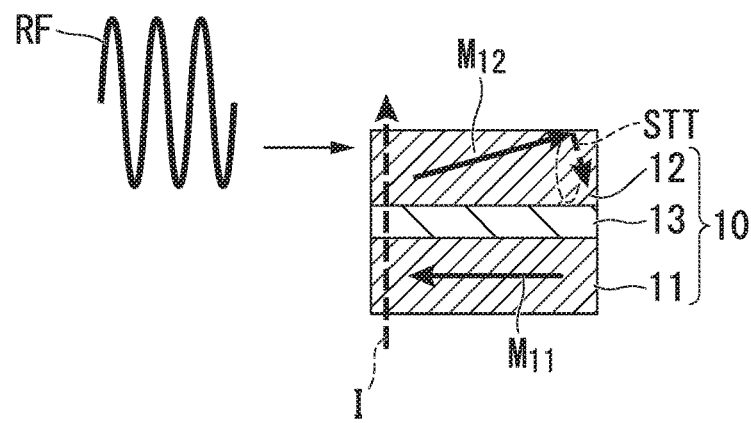
FIG. 3 is a schematic diagram showing a phenomenon occurring in the vicinity of the magnetoresistance effect element when a magnetoresistance effect device is operated.

FIG. 3 is a diagram schematically showing a phenomenon occurring in the vicinity of the magnetoresistance effect element 10 when the magnetoresistance effect device 100 operates. As shown in FIG. 3, a frequency magnetic field RF generated from the first signal line 20 is applied to the magnetization free layer 12. The high frequency magnetic field RF oscillates a magnetization $M_{12}$ of the magnetization free layer 12. The magnetization $M_{12}$ of the magnetization free layer 12 precesses.

A DC current I is applied for reading the change in the resistance value due to this precession. Therefore, ideally the DC current I should not act on the magnetization $M_{12}$ of the magnetization free layer 12 at all. However, an electron spin transferred by the DC current I induces a spin transfer torque STT.

Figure 4A:
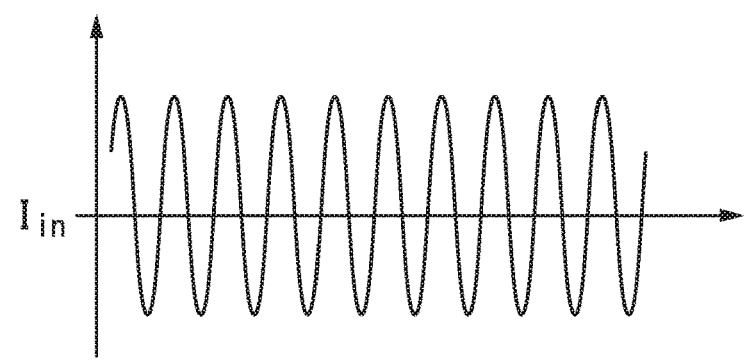
FIG. 4A is a diagram schematically showing a change in a high frequency current applied to a magnetoresistance effect device.
Figure 4B:
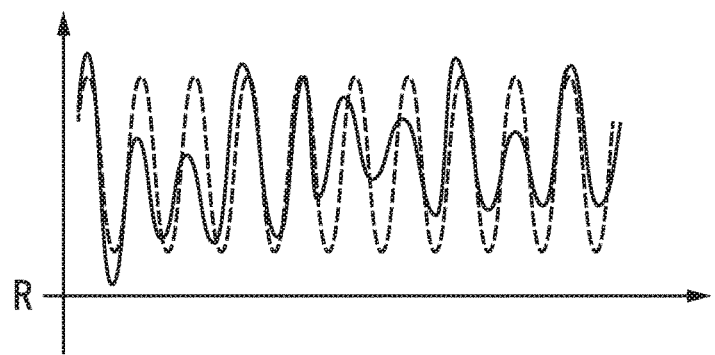
FIG. 4B is a diagram schematically showing a change in a resistance value of the magnetoresistance effect element.

FIGS. 4A and 4B are a diagram schematically showing changes in a high frequency current $I_{in}$ flowing in the first signal line 20 and a resistance value R of the magnetoresistance effect element 10 according to the high frequency signal input to the magnetoresistance effect device. FIG. 4A is a diagram showing variation in the high frequency current $I_{in}$, and FIG. 4B is a diagram showing change in the resistance value R of the magnetoresistance effect element 10. An oscillation period of the high frequency current $I_{in}$ matches an oscillation period of the high frequency magnetic field RF.

In an ideal state in which a spin transfer torque STT is not generated, the oscillation period of the high frequency current $I_{in}$ and the oscillation period of the magnetization $M_{12}$ of the magnetization free layer 12 have a correspondence relationship (a dotted line in FIG. 4B). In this case, a responsiveness of the output signal (a change in a resistance value) output from the magnetoresistance effect device 100 to the high frequency signal (high frequency current $I_{in}$) input to the magnetoresistance effect device 100 is high, and a signal with less noise is output.

On the other hand, when a spin transfer torque STT is generated, an ideal precession of the magnetization $M_{12}$ of the magnetization free layer 12 is disturbed. Therefore, the change in the resistance value R of the magnetoresistance effect element 10 is disturbed, and the responsiveness of the output signal (the change in a resistance value) output from the magnetoresistance effect device 100 is degraded. That is, a signal including noise is output from the magnetoresistance effect device 100.

It is thought that the influence of this spin transfer torque STT can be reduced when the DC current I flows from the magnetization fixed layer 11 to the magnetization free layer 12 of the magnetoresistance effect element 10. The reason for this thinking of the inventors will be described below. A behavior of the magnetization $M_{12}$ of the magnetization free layer 12 in minute time periods can be expressed by Equation (1) below.

$$\frac{\partial M_{12}}{\partial t} = -|\gamma|(M_{12} \times H_{\mathit{eff}}) - |\gamma|\alpha\hat{m}_{12} \times (M_{12} \times H_{\mathit{eff}}) + g\frac{\hbar}{2}\frac{I_e}{e}\hat{m}_{12} \times (\hat{m}_{12} \times \hat{m}_{11}) \quad (1)$$

In Equation (1), $\gamma$ denotes a gyro constant, $\alpha$ denotes a damping constant, h—denotes a Dirac constant, e denotes a charge, $I_e$ denotes a current density, g denotes a transfer efficiency, $M_{12}$ denotes the magnetization of the magnetization free layer, $m_{12}$ is a unit vector of the magnetization of the magnetization free layer, $m_{11}$ denotes a unit vector of the magnetization of the magnetization fixed layer, and $H_{\mathit{eff}}$ denotes an effective magnetic field in the magnetization free layer.

The first term in Equation (1) represents an influence of a precession torque, the second term represents an influence of a damping torque, and the last term represents an influence of the spin transfer torque. The DC current flowing through the magnetoresistance effect element 10 is expressed as a current density ($I_e$) in Equation (1). That is, a direction of the DC current flowing through the magnetoresistance effect element 10 influences a direction in which the spin transfer torque acts on the magnetization $M_{12}$ of the magnetization free layer 12.

Figure 5:
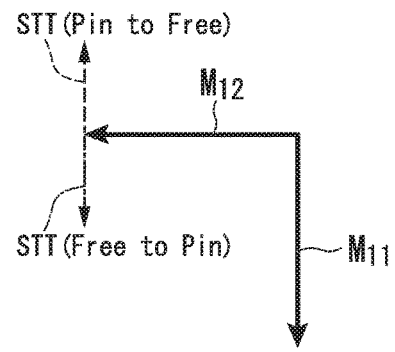
FIG. 5 is a diagram schematically showing a direction of magnetization of a magnetization fixed layer, a direction of magnetization of a magnetization free layer, and a direction of a spin transfer torque applied to the magnetization of the magnetization free layer when the magnetoresistance effect element is viewed in a stacking direction.

FIG. 5 is a diagram schematically showing the direction of the magnetization $M_{11}$ of the magnetization fixed layer 11, the direction of the magnetization $M_{12}$ of the magnetization free layer 12, and the direction of the spin transfer torque applied to the magnetization $M_{12}$ of the magnetization free layer 12 when the magnetoresistance effect element 10 is viewed in a stacking direction. The spin transfer torque acts in a direction perpendicular to the magnetization $M_{12}$ of the magnetization free layer 12. When a DC current flows from the magnetization fixed layer 11 to the magnetization free layer 12, the spin transfer torque acts in a direction having a component in a direction opposite to the direction of the magnetization $M_{11}$ of the magnetization fixed layer 11. On the other hand, when the DC current flows from the magnetization free layer 12 to the magnetization fixed layer 11, the spin transfer torque acts in a direction having a component in the same direction as the direction of the magnetization $M_{11}$ of the magnetization fixed layer 11.

Figure 6A:
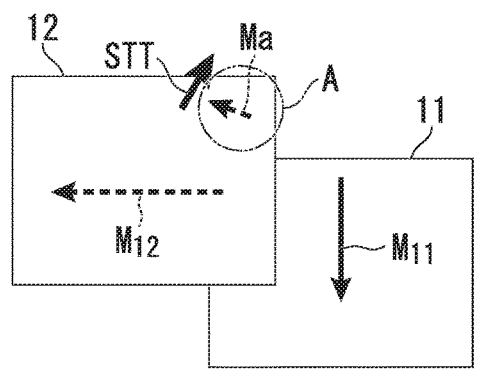
FIG. 6A is a diagram schematically showing a behavior of magnetization when the magnetoresistance effect element is viewed in the stacking direction.
Figure 6B:
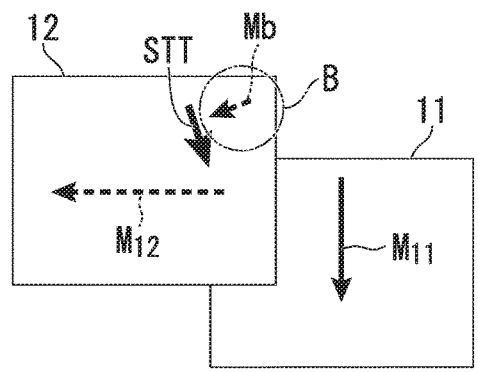
FIG. 6B is a diagram schematically showing a behavior of magnetization when the magnetoresistance effect element is viewed in the stacking direction.

FIGS. 6A and 6B are a diagram schematically showing a behavior of magnetization when the magnetoresistance effect element 10 is viewed in a stacking direction. Although the magnetization fixed layer 11 and the magnetization free layer 12 inherently overlap, the magnetization fixed layer 11 and the magnetization free layer 12 are shown to be shifted from each other for illustration in the drawing. FIG. 6A is a diagram in a case in which a current flows from the magnetization fixed layer 11 to the magnetization free layer 12 in the magnetoresistance effect element 10, and FIG. 6B is a diagram in a case in which a current flows from the magnetization free layer 12 to the magnetization fixed layer 11 in the magnetoresistance effect element 10.

In the case in which the current flows from the magnetization fixed layer 11 to the magnetization free layer 12, the magnetization Ma of a part to which the spin transfer torque is applied orients in a direction opposite to the direction of the magnetization $M_{11}$ of the magnetization fixed layer 11, as shown in FIG. 6A. That is, a resistance value of a region A in which there is the magnetization Ma is greater than those of other parts.

On the other hand, when the current flows from the magnetization free layer 12 to the magnetization fixed layer 11, the magnetization Mb of the part to which the spin transfer torque is applied orients in the same direction as the direction of the magnetization $M_{11}$ of the magnetization fixed layer 11, as shown in FIG. 6B. That is, the resistance value of a region B in which there is the magnetization Mb is smaller than those of other parts.

When the resistance value of the region A and the region B before the region A and the region B are influenced by the spin transfer torque is $R_1$ and a resistance value of the other region is $R_2$, a resistance value R of the entire magnetoresistance effect element 10 is expressed as $R=R_1 \cdot R_2/(R_1+R_2)$. Areas of the region A and the region B are equal to each other and the resistance values thereof are equal to each other. When the region A is influenced by the spin transfer torque, the resistance value increases and becomes $R_1+\alpha$. On the other hand, when the region B is influenced by the spin transfer torque, the resistance value decreases and becomes $R_1-\alpha$. For the sake of simplicity, it is assumed that the amounts a of variation in the resistance values of the region A and the region B due to the influence of the spin transfer torque are equal to each other.

When the amounts of a resistance value change $|\Delta R|$ between before and after the influence of the spin transfer torque are obtained in the respective cases, the following relational equations are satisfied.

$$|\Delta R| = \left| \frac{(R_1+\alpha) \cdot R_2}{\{(R_1+\alpha)+R_2\}} - \frac{R_1 \cdot R_2}{R_1+R_2} \right| \quad (2)$$

$$= \frac{R_2^2}{(R_1+R_2) \cdot \left\{ \left(\frac{R_1+R_2}{\alpha}\right) + 1 \right\}}$$

$$|\Delta R| = \left| \frac{(R_1-\alpha) \cdot R_2}{\{(R_1-\alpha)+R_2\}} - \frac{R_1 \cdot R_2}{R_1+R_2} \right| \quad (3)$$

$$= \frac{R_2^2}{(R_1+R_2) \cdot \left\{ \left(\frac{R_1+R_2}{\alpha}\right) - 1 \right\}}$$

Equation (2) shows the amount of change in resistance value when the resistance of a region A increases as shown in FIG. 6A. Equation (3) shows the amount of change in resistance value when the resistance of a region B decreases as shown in FIG. 6B. When Equations (2) and (3) are compared, the denominator is greater and the change in the resistance value is smaller in Equation (2). That is, the influence of the spin transfer torque on the resistance value of the entire magnetoresistance effect element 10 is smaller when the resistance value of the region A is higher as shown in FIG. 6A.

As described above, Equation (2) corresponds to a case in which a DC current flows from the magnetization fixed layer 11 to the magnetization free layer 12, and Equation (3) corresponds to the DC current from the magnetization free layer 12 to the magnetization fixed layer 11. That is, it is thought that the influence of the spin transfer torque on the resistance value of the magnetoresistance effect element 10 can be reduced by flowing the DC current from the magnetization fixed layer 11 to the magnetization free layer 12.

Although more specific description has been given using the equations, a more conceptual description can be given as follows.

In the case of FIG. 6A, the resistance value of the region A increases under the influence of the spin transfer torque. Therefore, a large amount of DC current flows into a region in which the influence of the spin transfer torque is small. In the region in which the influence of the spin transfer torque is small, noise hardly occurs (see a dotted line in FIG. 4B).

That is, since the DC current flowing in this region becomes dominant, it is thought that the responsiveness of the output signal (a change in a resistance value) output from the magnetoresistance effect device 100 to the high frequency signal (the high frequency current $I_{in}$) input to the magnetoresistance effect device 100 increases.

On the other hand, in the case of FIG. 6B, the resistance value of the region B decreases under the influence of the spin transfer torque. Therefore, a large amount of DC current flows in the region B influenced by the spin transfer torque. Therefore, the influence of the spin transfer torque is added as noise (see a solid line in FIG. 4B). As a result, it is thought that the responsiveness of the output signal (the change in a resistance value) output from the magnetoresistance effect device 100 to the high frequency signal (high frequency current $I_{in}$) input to the magnetoresistance effect device 100 decreases.

Therefore, when the DC current is applied in a direction from the magnetization fixed layer 11 to the magnetization free layer 12 of the magnetoresistance effect element 10, the precession of the magnetization $M_{12}$ of the magnetization free layer 12 oscillating due to the high frequency magnetic field can be stabilized. As a result, it is thought that noise in the signal output from the magnetoresistance effect device 100 can be suppressed.

<Change in Ferromagnetic Resonance Frequency>

The frequency selected by the magnetoresistance effect device 100 (the frequency band output by the magnetoresistance effect device 100) can be changed by changing the ferromagnetic resonance frequency of the magnetization free layer 12. The ferromagnetic resonance frequency changes according to an effective magnetic field in the magnetization free layer 12. The effective magnetic field $H_{eff}$ in the magnetization free layer 12 is expressed by the following equation when an external magnetic field applied to the magnetization free layer 12 is defined as $H_E$, an anisotropic magnetic field in the magnetization free layer 12 is defined as $H_k$, a demagnetizing field in the magnetization free layer 12 is defined as $H_D$, and an exchange coupling magnetic field in the magnetization free layer 12 is defined as $H_{EX}$.

$$H_{eff}=H_E+H_k+H_D+H_{EX}$$

Figure 7:
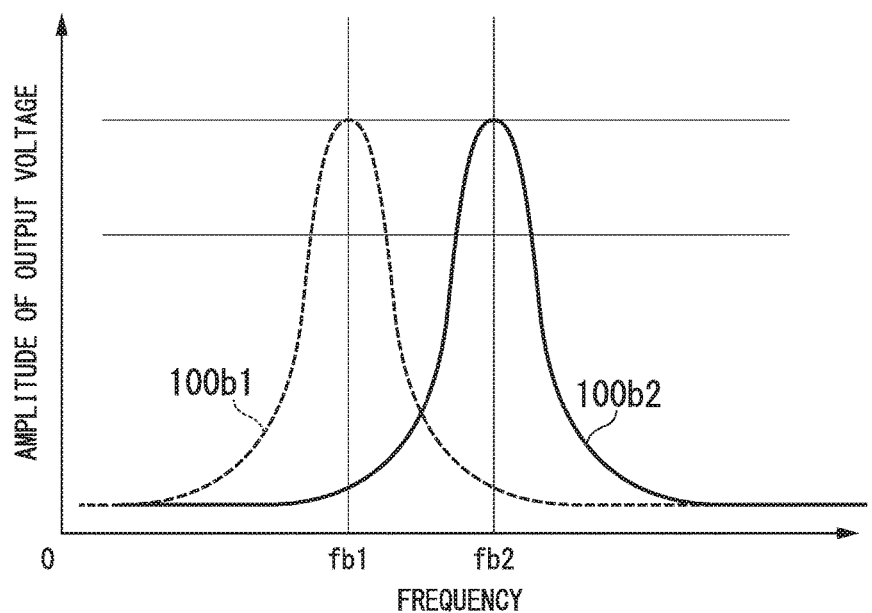
FIG. 7 is a diagram showing a relationship between a frequency of a high frequency signal input to the magnetoresistance effect device and an amplitude of an output voltage when a DC current applied to the magnetoresistance effect element is constant.

As shown in the above equation, the effective magnetic field in the magnetization free layer 12 is influenced by the external magnetic field $H_E$. A magnitude of the external magnetic field $H_E$ can be set by the frequency setting apparatus 50. That is, the effective magnetic field in the magnetization free layer 12 can be set by the frequency setting apparatus 50. FIG. 7 is a diagram showing a relationship between a frequency of the high frequency signal input to the magnetoresistance effect device 100 and an amplitude of an output voltage when the DC current applied to the magnetoresistance effect element 10 is constant.

When an arbitrary external magnetic field is applied from the frequency setting apparatus 50 to the magnetoresistance effect element 10, the ferromagnetic resonance frequency of the magnetization free layer 12 changes under the influence of the external magnetic field. The ferromagnetic resonance frequency in this case is fb1. Since the ferromagnetic resonance frequency of the magnetization free layer 12 is fb1, the amplitude of the output voltage becomes high when the frequency of the high frequency signal input to the magnetoresistance effect device 100 is fb1. Therefore, a graph of a plot line 100b1 shown in FIG. 7 is obtained.

Then, when the applied external magnetic field is increased, the ferromagnetic resonance frequency is shifted from fb1 to fb2 under the influence of the external magnetic field. In this case, a frequency at which the amplitude of the output voltage increases is also shifted from fb1 to fb2. As a result, a graph of a plot line 100b2 shown in FIG. 7 is obtained. Thus, the frequency setting apparatus 50 can adjust the external magnetic field $H_E$ (that is, the effective magnetic field $H_{eff}$ in the magnetization free layer 12) applied to the magnetization free layer 12 of the magnetoresistance effect element 10 to change the ferromagnetic resonance frequency.

<Other Uses>

Further, although the case in which the magnetoresistance effect device is used as a high frequency filter has been presented above as an example, the magnetoresistance effect device can also be used as a high frequency device such as an isolator, a phase shifter, or an amplifier.

When the magnetoresistance effect device is used as an isolator, a signal is input from the second port 2. Even when the signal is input from the second port 2, there is no output from the first port 1, and therefore, a function of an isolator is obtained.

Further, in a case in which the magnetoresistance effect device is used as a phase shifter, attention is paid to a frequency of an arbitrary point in an output frequency band in a case in which the output frequency band changes. When the output frequency band changes, a phase at a specific frequency changes, and therefore, a function of a phase shifter is obtained.

Further, when the magnetoresistance effect device is used as an amplifier, the DC current or the DC voltage applied from the power supply 41 is set to a predetermined magnitude or more. By doing so, a signal output from the second port 2 becomes greater than a signal input from the first port 1, and a function of an amplifier is obtained.

As described above, the magnetoresistance effect device 100 according to the first embodiment can function as a high frequency device such as a high frequency filter, an isolator, a phase shifter, or an amplifier.

The magnetoresistance effect device 100 according to the first embodiment controls the direction of the DC current or the DC voltage to be applied to the magnetoresistance effect element 10. Therefore, it is possible to improve the responsiveness of the output signal (a change in a resistance value) output from the magnetoresistance effect device 100 to the high frequency signal (high frequency current $I_{in}$) input to the magnetoresistance effect device 100 and to reduce noise.

Second Embodiment

Figure 8:
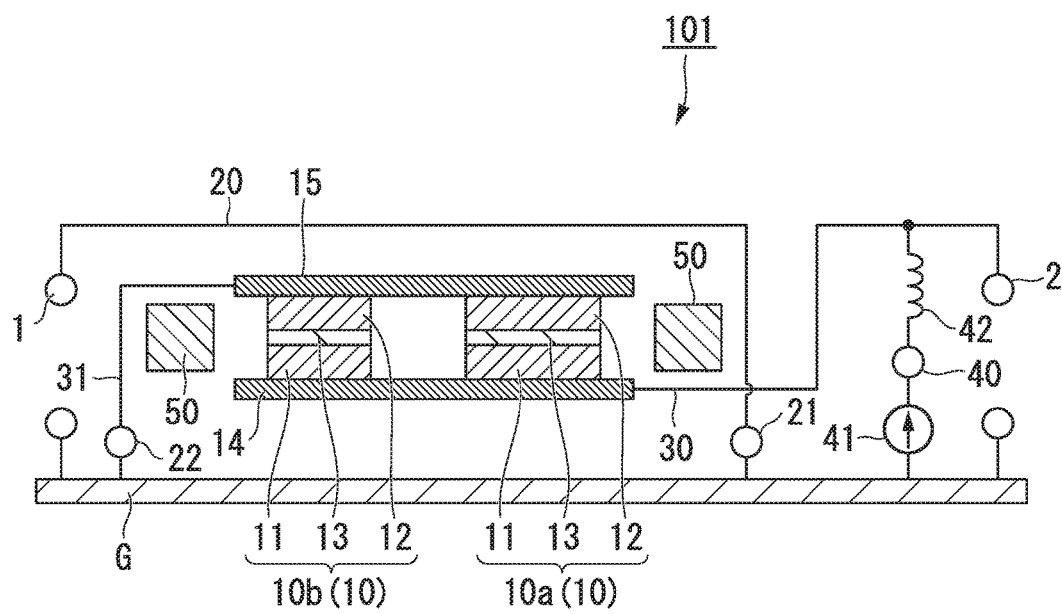
FIG. 8 is a diagram schematically showing a circuit configuration of a magnetoresistance effect device according to a second embodiment.

FIG. 8 is a diagram schematically showing a circuit configuration of the magnetoresistance effect device 101 according to a second embodiment. The magnetoresistance effect device 101 according to the second embodiment is different from the magnetoresistance effect device 100 according to the first embodiment in that there are a plurality of magnetoresistance effect elements 10, which are connected in parallel to each other. The other constituents are the same, and constituents which are the same are denoted with the same reference numerals.

The magnetoresistance effect device 101 shown in FIG. 8 includes a first magnetoresistance effect element 10a and a second magnetoresistance effect element 10b. The first magnetoresistance effect element 10a and the second magnetoresistance effect element 10b are connected in parallel to the second port 2 and the power supply 41. A DC current or a DC voltage is applied from the power supply 41 to the first magnetoresistance effect element 10a and the second magnetoresistance effect element 10b and, in either the first magnetoresistance effect element 10a or the second magnetoresistance effect element 10b, a DC current flows from the magnetization fixed layer 11 to the magnetization free layer 12 in the magnetoresistance effect element.

The first magnetoresistance effect element 10a and the second magnetoresistance effect element 10b have different ferromagnetic resonance frequencies of their magnetization free layers. The ferromagnetic resonance frequency of each magnetization free layer can be controlled by changing a shape in a plan view when the first magnetoresistance effect element 10a and the second magnetoresistance effect element 10b are viewed in a stacking direction. When two magnetoresistance effect elements having the different ferromagnetic resonance frequencies of the respective magnetization free layers are used, the respective magnetoresistance effect elements exhibit a great change in a resistance value at the ferromagnetic resonance frequency of the respective magnetization free layers, and an output corresponding to a sum thereof is output from the second port 2. Therefore, a frequency in a range obtained by superimposing the ferromagnetic resonance frequencies of the respective magnetization free layers becomes a selected frequency (a passing frequency) of the magnetoresistance effect device 101, and the band of the selected frequency (a passing frequency band) widens.

Figure 9:
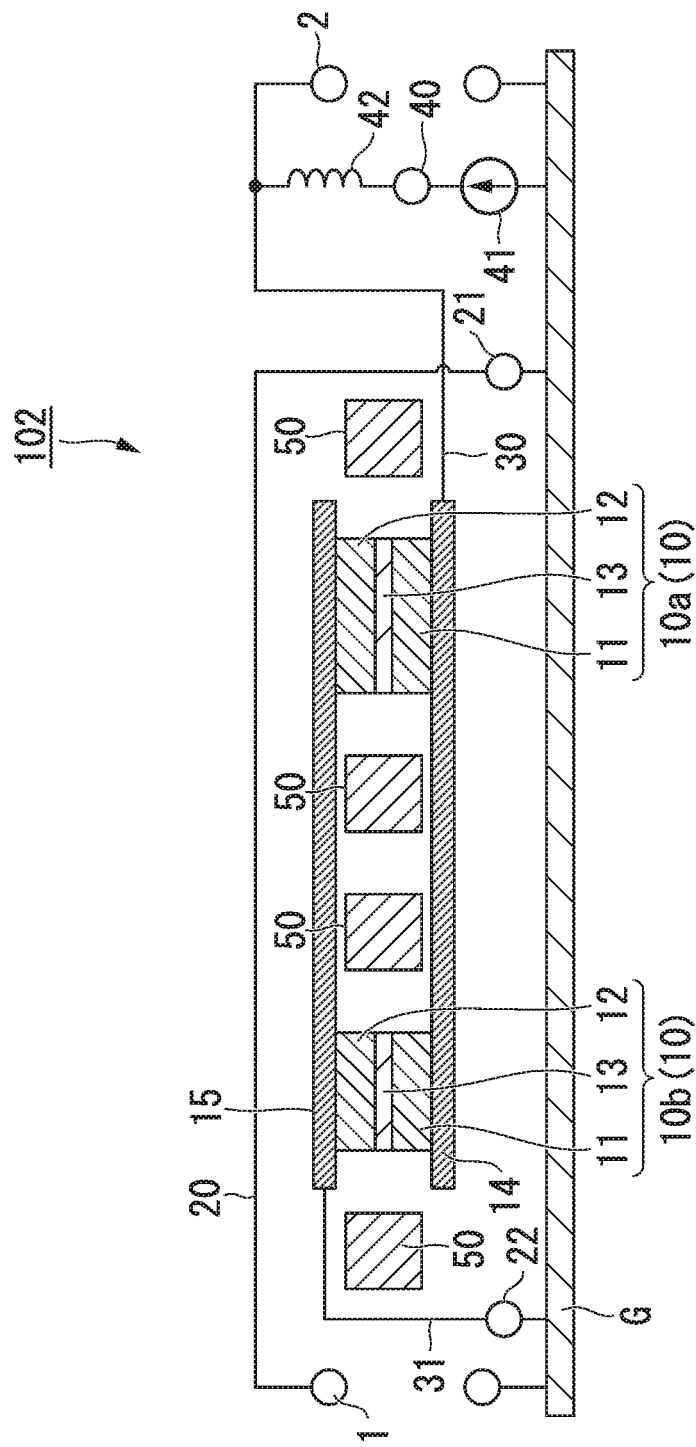
FIG. 9 is a diagram schematically showing another example of the circuit configuration of the magnetoresistance effect device according to the second embodiment.

The frequency setting apparatus 50 may be used as one entity in common for the first magnetoresistance effect element 10a and the second magnetoresistance effect element 10b (see FIG. 8) or may be provided for each of the first magnetoresistance effect element 10a and the second magnetoresistance effect element 10b (see FIG. 9). When the frequency setting apparatus 50 is provided for each magnetoresistance effect element as in the magnetoresistance effect device 102 shown in FIG. 9, integration of the magnetoresistance effect device 102 is degraded, but a degree of freedom of setting the selected frequency (the passing frequency) of the magnetoresistance effect device 102 is increased.

Further, the number of magnetoresistance effect elements is not limited to two, and more elements may be provided. In this case, it is preferable for the ferromagnetic resonance frequency of the magnetization free layer of at least one of a plurality of magnetoresistance effect elements to be designed to be different from the ferromagnetic resonance frequencies of the magnetization free layers of the other magnetoresistance effect elements. The ferromagnetic resonance frequency may be controlled with a shape of the magnetization free layer of the magnetoresistance effect element or may be set according to an external magnetic field that is applied from the frequency setting apparatus.

Third Embodiment

Figure 10:
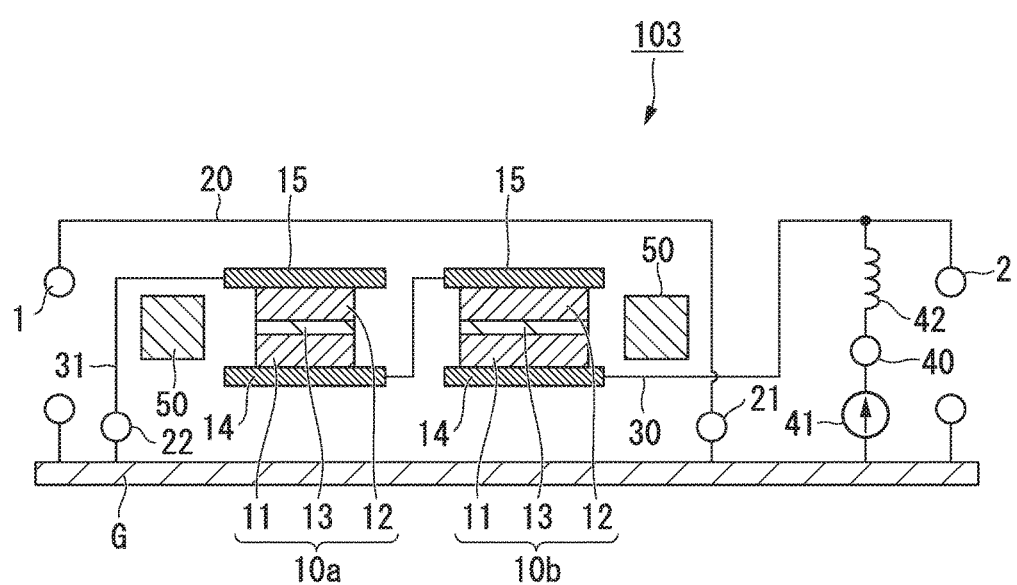
FIG. 10 is a diagram schematically showing a circuit configuration of a magnetoresistance effect device according to a third embodiment.

FIG. 10 is a diagram schematically showing a circuit configuration of a magnetoresistance effect device 103 according to a third embodiment. The magnetoresistance effect device 103 according to the third embodiment is different from the magnetoresistance effect device 100 according to the first embodiment in that there are a plurality of magnetoresistance effect elements 10, which are connected in series. The other constituents are the same, and constituents which are the same are denoted with the same reference numerals.

In the magnetoresistance effect device 103 shown in FIG. 10, a first magnetoresistance effect element 10a and a second magnetoresistance effect element 10b are connected in series in a closed circuit formed of a power supply 41, an output signal line 30, a line 31, and a ground G A DC current or a DC voltage is applied from the power supply 41 to the first magnetoresistance effect element 10a and the second magnetoresistance effect element 10b and, in either the first magnetoresistance effect element 10a or the second magnetoresistance effect element 10b, a DC current flows from the magnetization fixed layer 11 to the magnetization free layer 12 in the magnetoresistance effect element.

The first magnetoresistance effect element 10a and the second magnetoresistance effect element 10b have different ferromagnetic resonance frequencies of magnetization free layers thereof. As in the case of parallel connection (the second embodiment), when two magnetoresistance effect elements with different ferromagnetic resonance frequencies of the respective magnetization free layers are connected in series, the respective magnetoresistance effect elements exhibit a great change in a resistance value at the ferromagnetic resonance frequency of the respective magnetization free layers, and therefore, an output corresponding to a sum thereof is output from the second port 2. Therefore, a frequency in a range obtained by superimposing the ferromagnetic resonance frequencies of the respective magnetization free layers becomes a selected frequency (a passing frequency) of the magnetoresistance effect device 103, and a band of the selected frequency (a passing frequency band) widens.

Figure 11:
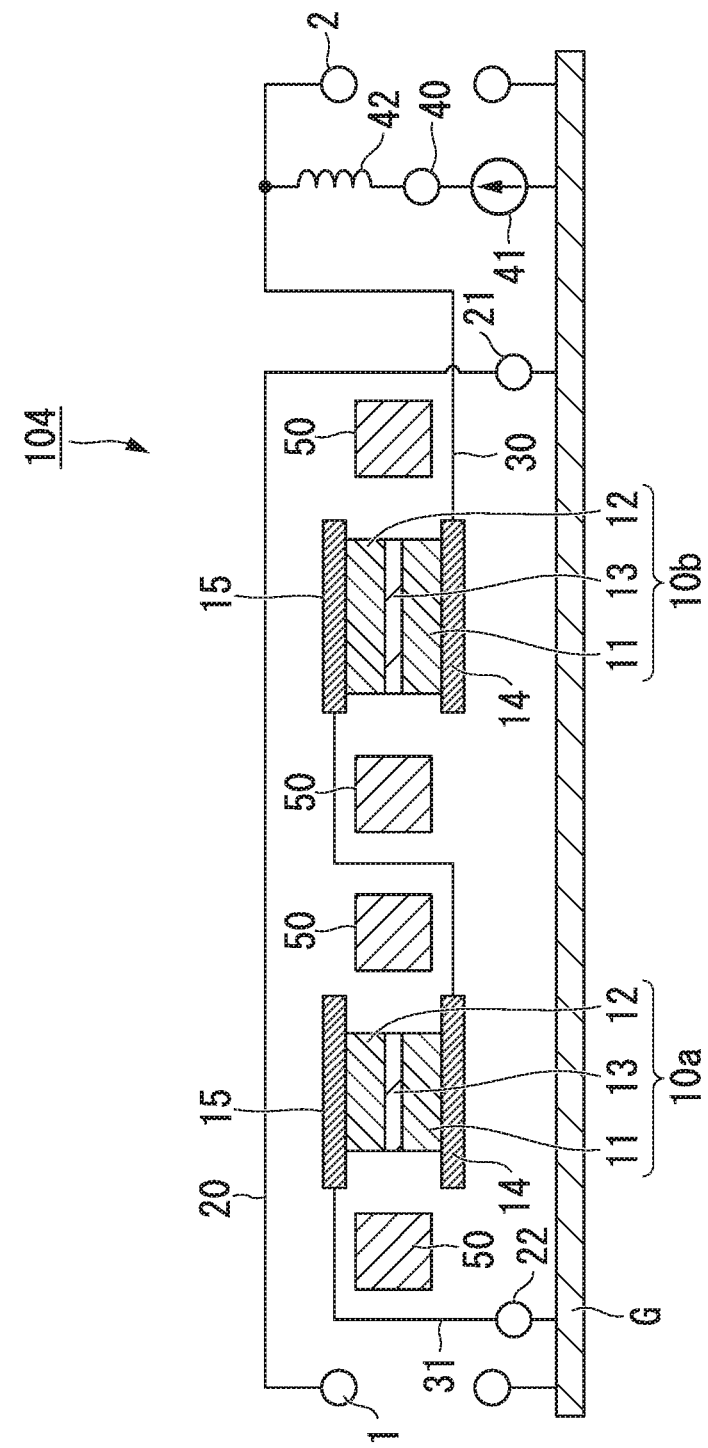
FIG. 11 is a diagram schematically showing another example of the circuit configuration of the magnetoresistance effect device according to the third embodiment.

In the case of series connection, the frequency setting apparatus 50 may be used as one entity in common for the first magnetoresistance effect element 10a and the second magnetoresistance effect element 10b (See FIG. 10) or one may be provided for each of the first magnetoresistance effect element 10a and the second magnetoresistance effect element 10b (see FIG. 11), as in the case of parallel connection (the second embodiment). When the frequency setting apparatus 50 is provided for each magnetoresistance effect element as in the magnetoresistance effect device 104 shown in FIG. 11, integration of the magnetoresistance effect device 104 is degraded, but the degree of freedom of setting the selected frequency (the passing frequency) of the magnetoresistance effect device 104 is increased.

Further, the number of magnetoresistance effect elements is not limited to two, and more elements may be provided. In this case, it is preferable for the ferromagnetic resonance frequency of the magnetization free layer of at least one of a plurality of magnetoresistance effect elements to be designed to be different from the ferromagnetic resonance frequencies of the magnetization free layers of the other magnetoresistance effect elements. Each ferromagnetic resonance frequency may be controlled with a shape of the magnetoresistance effect element or may be set according to an external magnetic field that is applied from the frequency setting apparatus.

Fourth Embodiment

Figure 12:
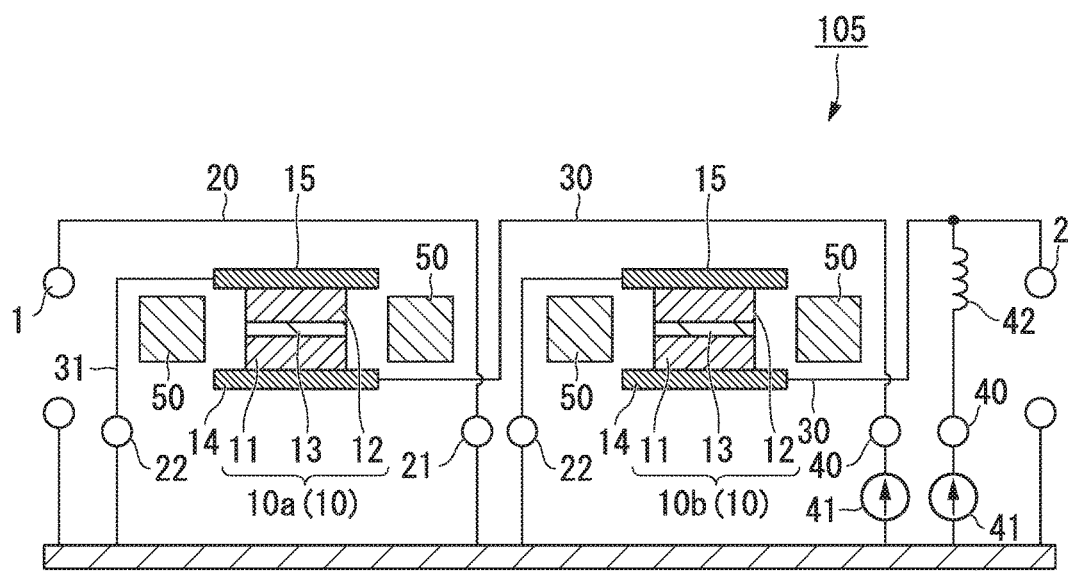
FIG. 12 is a diagram schematically showing a circuit configuration of a magnetoresistance effect device according to a fourth embodiment.

FIG. 12 is a diagram schematically showing a circuit configuration of a magnetoresistance effect device 105 according to a fourth embodiment.

The magnetoresistance effect device 105 according to the fourth embodiment is different from the magnetoresistance effect device 100 according to the first embodiment in that there are a plurality of magnetoresistance effect elements 10, and in a method of disposing each signal line. The other constituents are the same, and constituents which are the same are denoted with the same reference numerals.

The magnetoresistance effect device 105 shown in FIG. 12 includes a first magnetoresistance effect element 10a and a second magnetoresistance effect element 10b. A DC current or a DC voltage is applied from the respective power supplies 41 to the first magnetoresistance effect element 10a and the second magnetoresistance effect element 10b and, in either the first magnetoresistance effect element 10a or the second magnetoresistance effect element 10b, a DC current flows from the magnetization fixed layer 11 to the magnetization free layer 12 in the magnetoresistance effect element.

A high frequency magnetic field generated from the first signal line 20 is applied to the magnetization free layer 12 of the first magnetoresistance effect element 10a, and a high frequency magnetic field generated from the output signal line 30 due to the output signal output from the first magnetoresistance effect element 10a is applied to the magnetization free layer 12 of the second magnetoresistance effect element 10b.

The high frequency signal input from the first port 1 to the magnetoresistance effect device 105 is filtered by the first magnetoresistance effect element 10a. The filtered high frequency signal is output from the output signal line 30. This high frequency signal is filtered by the second magnetoresistance effect element 10b and output from the second port 2 to the outside of the magnetoresistance effect device 105. That is, the signal input from the first port 1 of the magnetoresistance effect device 105 is filtered twice before the signal is output from the second port 2. Therefore, according to the magnetoresistance effect device 105, it is possible to improve the filtering accuracy for a high frequency signal.

Further, the number of magnetoresistance effect elements is not limited to two, and more elements may be provided. In this case, a high frequency magnetic field from the first signal line is applied to at least one of a plurality of magnetoresistance effect elements, and a high frequency magnetic field from the output signal line connected to another magnetoresistance effect element is applied to the remaining magnetoresistance effect elements. By increasing the number of magnetoresistance effect elements, it is possible to further enhance filtering accuracy for the high frequency signal.

Further, the number of the magnetoresistance effect elements disposed in each closed circuit formed of the power supply 41, the output signal line 30, the line 31, and the ground G is not limited to one and may be plural. The magnetoresistance effect elements may be connected in parallel or in series.

Although the embodiments of the present disclosure have been described above in detail with reference to the drawings, the respective configurations, combinations thereof, and the like in the respective embodiments are merely examples, and additions, omissions, substitutions, and other changes of the configurations can be performed without departing from the gist of the present disclosure.

Figure 13:
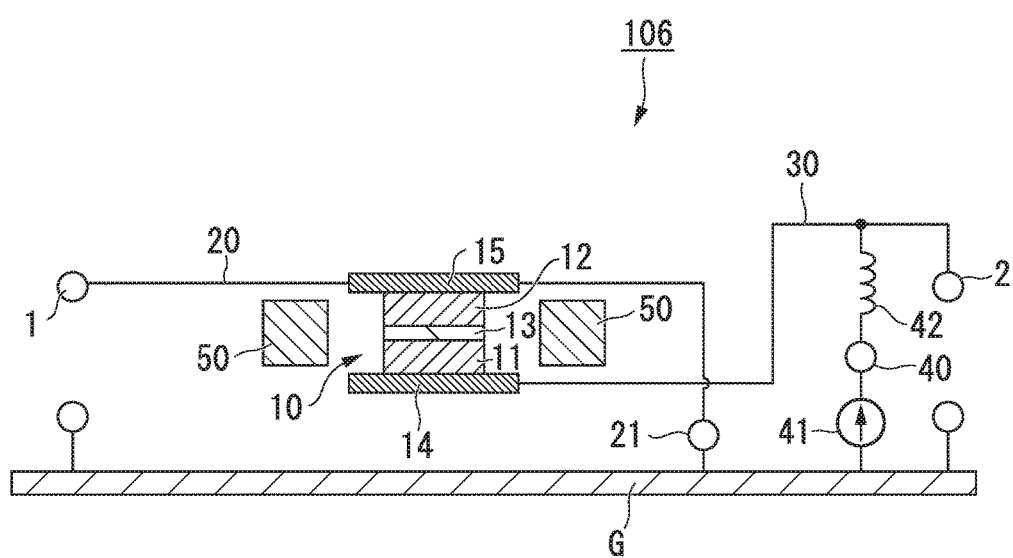
FIG. 13 is a diagram schematically showing another example of the circuit configuration of the magnetoresistance effect device according to the first embodiment.

For example, the first signal line 20 may also serve as the lower electrode 14 or the upper electrode 15 connected to the magnetoresistance effect element 10. FIG. 13 is a schematic diagram showing a circuit configuration of another example of the magnetoresistance effect device according to the first embodiment. In the magnetoresistance effect device 106 shown in FIG. 13, the first signal line 20 is connected to the magnetization free layer 12 of the magnetoresistance effect element 10.

Figure 14:
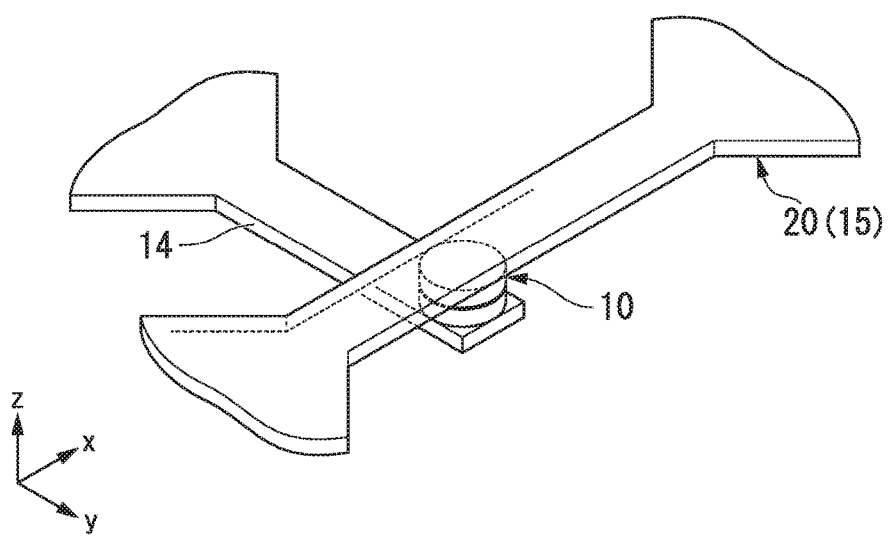
FIG. 14 is an enlarged perspective view of the vicinity of the magnetoresistance effect element of the magnetoresistance effect device shown in FIG. 13.

FIG. 14 is an enlarged perspective view of the vicinity of the magnetoresistance effect element 10 of the magnetoresistance effect device 106 shown in FIG. 13. As shown in FIG. 14, the first signal line 20 is connected to the magnetization free layer 12 of the magnetoresistance effect element 10, and a part of the first signal line 20 also serves as the upper electrode 15. Although the case in which the first signal line 20 is connected to the magnetization free layer 12 and the first signal line 20 also serves as a part of the upper electrode 15 has been specifically described, the first signal line 20 may be connected to the magnetization fixed layer 11 and the first signal line 20 may also serve as a part of the lower electrode 14. Further, when there are a plurality of magnetoresistance effect elements 10 as in the second to fourth embodiments, the first signal line 20 can also serve as the lower electrode 14 or the upper electrode 15 for at least one magnetoresistance effect element 10.

Further, in the above embodiment, the example in which the DC application terminal 40 is connected between the inductor 42 and the ground G has been described. In addition, the DC application terminal 40 may be connected between the upper electrode 15 and the ground G In this case, the DC current source 41 is connected between the DC application terminal 40 and the ground and the inductor 42 is connected between the output signal line 30 and the ground G via the reference potential terminal.

Further, a resistive element may be used instead of the inductor 42 in the above embodiment. This resistive element has a function of cutting off high frequency components of a current using a resistance component. This resistive element may be either a chip resistor or a resistor based on a pattern line. A resistance value of this resistive element is preferably equal to or higher than a characteristic impedance of the output signal line 30. For example, when the characteristic impedance of the output signal line 30 is 50Ω and the resistance value of the resistive element is 50Ω, 45% of high frequency power can be cut off by the resistive element. Further, when the characteristic impedance of the output signal line 30 is 50Ω and the resistance value of the resistive element is 500Ω, 90% of high frequency power can be cut off by the resistive element. In this case, it is also possible for the output signal output from the magnetoresistance effect element 10 to flow efficiently to the second port 2.

Further, in the above embodiment, the inductor 42 may be removed when the power supply 41 connected to the DC application terminal 40 has a function of cutting off a high frequency component of a current and passing an invariant component of the current. In this case, it is also possible for the output signal output from the magnetoresistance effect element 10 to flow efficiently to the second port 2.

The above embodiment has been described on the basis of the example in which the frequency setting apparatus 50 is used as a magnetic field application apparatus, but the following other examples can be used for the frequency setting apparatus 50. For example, an electric field application apparatus that applies an electric field to the magnetoresistance effect element may be used as the frequency setting apparatus. When the electric field applied to the magnetization free layer of the magnetoresistance effect element is changed by the electric field application apparatus, an anisotropic magnetic field $H_k$ in the magnetization free layer changes and the effective magnetic field in the magnetization free layer changes. The ferromagnetic resonance frequency of the magnetization free layer is then set.

Further, for example, a piezoelectric body and the electric field application apparatus may be combined as the frequency setting apparatus. The piezoelectric body is provided in the vicinity of the magnetization free layer of the magnetoresistance effect element, and an electric field is applied to the piezoelectric body. The piezoelectric body to which the electric field has been applied is deformed to distort the magnetization free layer. When the magnetization free layer is distorted, the anisotropic magnetic field $H_k$ in the magnetization free layer changes, and the effective magnetic field in the magnetization free layer changes. The ferromagnetic resonance frequency of the magnetization free layer is then set.

Further, for example, a control film that is an antiferromagnetic or ferrimagnetic material having an electromagnetic effect, an apparatus that applies a magnetic field to the control film, and an apparatus that applies an electric field to the control film may be used as the frequency setting apparatus. An electric field and a magnetic field are applied to the control film provided to be magnetically coupled to the magnetization free layer. When at least one of the electric field and the magnetic field applied to the control film is changed, the exchange coupling magnetic field $H_{EX}$ in the magnetization free layer changes, and the effective magnetic field in the magnetization free layer changes. The ferromagnetic resonance frequency of the magnetization free layer is then set.

Further, in a case in which the ferromagnetic resonance frequency of the magnetization free layer of the magnetoresistance effect element is a desired frequency even when there is no frequency setting apparatus 50 (even when a static magnetic field is not applied from the magnetic field application apparatus), the frequency setting apparatus 50 may not be included.

EXAMPLES

Example 1

An S/N ratio of the signal output from the magnetoresistance effect device when a direction in which the DC current or the DC voltage is applied to the magnetoresistance effect element was changed was obtained through simulation. The simulation was performed using an LLG simulation.

The simulation was performed under the following conditions.

Shape of the magnetoresistance effect element: 45 nm in diameter, cylindrical shape Damping constant α: 0.02

Saturation magnetization Ms of the magnetization free layer: 16 kOe

Anisotropic magnetic field $H_k$ of the magnetization free layer: 7 kOe

External magnetic field of the static magnetic field applied to the magnetization free layer: 1 kOe (direction perpendicular to the direction of the magnetization of the magnetization fixed layer)

High frequency magnetic field applied to the magnetization free layer: 2 Oe (31 frequency types in 0.2 GHz increments between 1 and 7 GHz, a direction parallel to the direction of the magnetization of the magnetization fixed layer)

Spin polarizability of the magnetization fixed layer P: 0.5

Further, S/N obtained through simulation is a ratio of a signal (S) output when a high frequency magnetic field at a frequency closest to the ferromagnetic resonance frequency of the magnetization free layer (a frequency of the high frequency magnetic field when the output signal is the greatest) is applied to an average value of a signal (N) that is output when high frequency magnetic fields of 30 other frequency types are applied.

Figure 15:
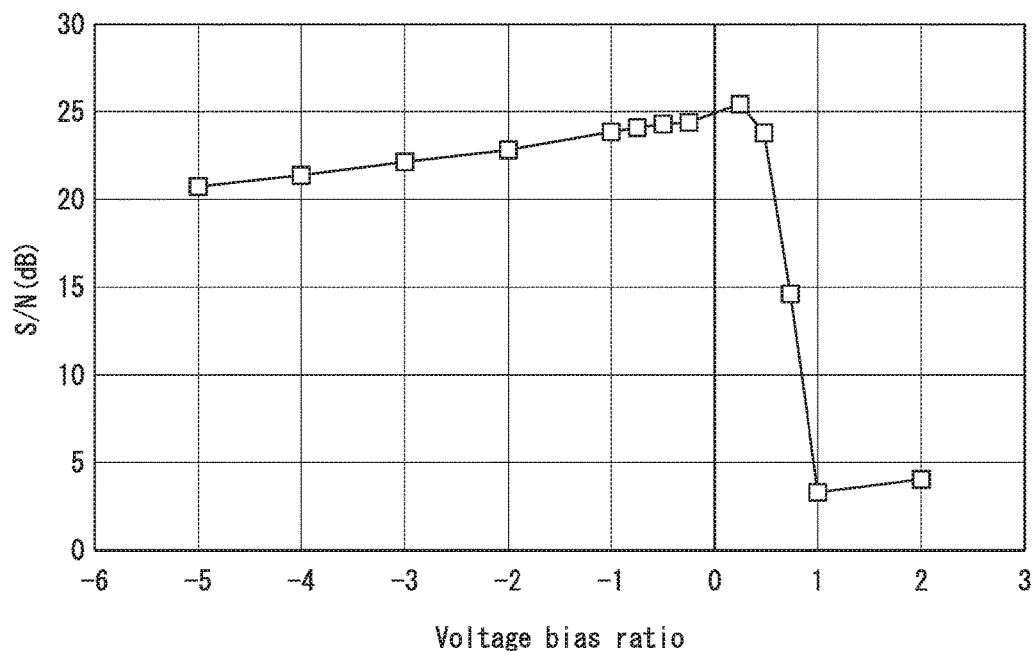
FIG. 15 shows simulation results when a voltage value of a constant voltage applied to the magnetoresistance effect element is changed in a case in which the constant voltage is applied to the magnetoresistance effect element.
Figure 16:
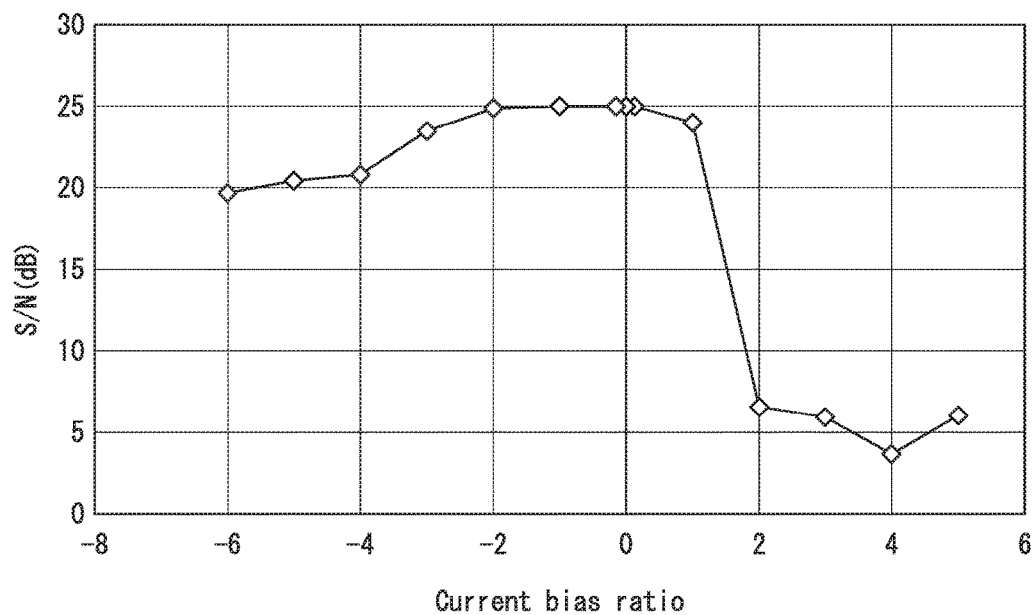
FIG. 16 shows simulation results when a current value of a constant current flowing in the magnetoresistance effect element is changed when the constant current is applied to the magnetoresistance effect element.

Results of the simulation are shown in FIGS. 15 and 16. FIG. 15 shows the simulation results when a voltage value of a constant voltage applied to the magnetoresistance effect element is changed in a case in which the constant voltage is applied to the magnetoresistance effect element, and FIG. 16 shows the simulation results when a current value of a constant current flowing in the magnetoresistance effect element is changed when the constant current is applied to the magnetoresistance effect element.

In FIGS. 15 and 16, a horizontal axis indicates a ratio of a voltage or a current to a reference which is a predetermined voltage or current. The voltage and the current are negative when applied in a direction in which a current flows from the magnetization fixed layer to the magnetization free layer and positive when applied in a direction in which the current flows from the magnetization free layer to the magnetization fixed layer. In addition, a vertical axis in FIGS. 15 and 16 indicates S/N.

In both FIGS. 15 and 16, it was confirmed that when the voltage or the current is applied in the direction in which the current flows from the magnetization free layer to the magnetization fixed layer, the S/N ratio decreases above a predetermined value. On the other hand, it was confirmed that a decrease in S/N is prevented when the voltage or the current is applied in the direction in which the current flows from the magnetization fixed layer to the magnetization free layer.

Example 2 and Comparative Example

A magnetoresistance effect device was actually fabricated and the output signal characteristics were obtained. The magnetoresistance effect device had the circuit configuration shown in FIG. 1. The magnetoresistance effect element was formed in a cylindrical shape having a diameter of 180 nm. The magnetization fixed layer had a stacked structure of CoFe (18 Å)/Ru (8 Å)/CoFe (8 Å)/CoFeB (10 Å) in an order of stacking. Further, the spacer layer was MgO (9.5 Å), and the free layer was CoFeB (20 Å). Further, IrMn (70 Å) was provided as an antiferromagnetic layer on a surface of the magnetization fixed layer opposite to the spacer layer.

A case in which a DC voltage of 0.25 V was applied so that a DC current flowed from the magnetization fixed layer to the magnetization free layer of the magnetoresistance effect element is Example 2 and a case in which a DC voltage of 0.25 V was applied so that a DC current flowed from the magnetization free layer to the magnetization fixed layer is a comparative example. The characteristics of the signal output from the magnetoresistance effect device were obtained while changing the frequency of the high frequency magnetic field applied to the magnetoresistance effect element.

Figure 17:
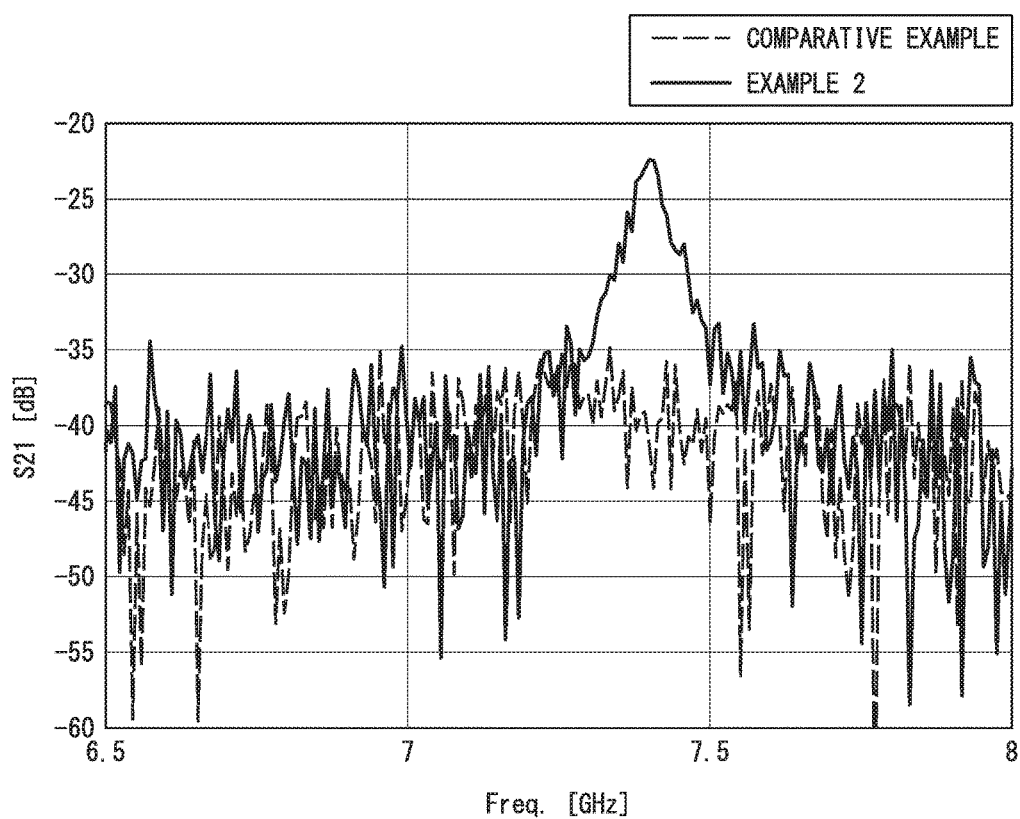
FIG. 17 is a diagram showing signal characteristics of Example 2 and a comparative example.

FIG. 17 is a diagram showing signal characteristics of Example 2 and a comparative example.

In FIG. 17, a vertical axis indicates pass characteristics of the magnetoresistance effect device represented as a common logarithm thereof (S21), and a horizontal axis indicates a frequency of the applied high frequency magnetic field. The pass characteristics of the magnetoresistance effect device are a power output from the magnetoresistance effect device divided by a power input to the magnetoresistance effect device. That is, $S21=10\times\log_{10}$ ([power of output signal]/[power of input signal]) holds.

As shown in FIG. 17, in Example 2, a larger peak than that in the comparative example was confirmed. That is, it can be said that the magnetoresistance effect device shown in Example 2 functions as a high frequency filter exhibiting excellent pass characteristics at a predetermined frequency.

What is claimed is:

1. A magnetoresistance effect device, comprising:
at least one magnetoresistance effect element including a magnetization fixed layer, a magnetization free layer of which a direction of magnetization is changeable relative to a direction of magnetization of the magnetization fixed layer, and a spacer layer sandwiched between the magnetization fixed layer and the magnetization free layer;
a first signal line that is configured to generate a high frequency magnetic field when a high frequency current flows and apply the high frequency magnetic field to the magnetization free layer; and
a DC application terminal that is configured to be capable of connecting a power supply for applying a DC current or a DC voltage in a stacking direction of the magnetoresistance effect element,
wherein the magnetoresistance effect element is disposed with respect to the DC application terminal such that the DC current flows from the magnetization fixed layer to the magnetization free layer in the magnetoresistance effect element or such that the DC voltage at which the magnetization fixed layer is higher in potential than the magnetization free layer is applied.

2. The magnetoresistance effect device according to claim 1, further comprising a frequency setting apparatus that is configured to be capable of setting a ferromagnetic resonance frequency of the magnetization free layer of the magnetoresistance effect element.

3. The magnetoresistance effect device according to claim 1, wherein the first signal line is connected to the at least one magnetoresistance effect element.

4. The magnetoresistance effect device according to claim 1,
wherein the at least one magnetoresistance effect element comprises a plurality of magnetoresistance effect elements,
the magnetoresistance effect elements are connected in parallel to each other, and
a ferromagnetic resonance frequency of the magnetization free layer of at least one of the magnetoresistance effect elements is different from a ferromagnetic resonance frequencies of the magnetization free layers of other magnetoresistance effect elements.

5. The magnetoresistance effect device according to claim 1, wherein the at least one magnetoresistance effect element comprises a plurality of magnetoresistance effect elements, the magnetoresistance effect elements are connected in parallel to each other, and a frequency setting apparatus that is configured to be capable of setting a ferromagnetic resonance frequencies of the magnetization free layers of each of the magnetoresistance effect elements is provided around each of the magnetoresistance effect elements.

6. The magnetoresistance effect device according to claim 1, wherein the at least one magnetoresistance effect element comprises a plurality of magnetoresistance effect elements, the magnetoresistance effect elements are connected in series to each other, and a ferromagnetic resonance frequency of the magnetization free layer of at least one of the magnetoresistance effect elements is different from a ferromagnetic resonance frequencies of the magnetization free layers of other magnetoresistance effect elements.

7. The magnetoresistance effect device according to claim 1, wherein the at least one magnetoresistance effect element comprises a plurality of magnetoresistance effect elements, the magnetoresistance effect elements are connected in series to each other, and a frequency setting apparatus that is configured to be capable of setting a ferromagnetic resonance frequency of the magnetization free layer of each of the magnetoresistance effect elements is provided around each of the plurality of magnetoresistance effect elements.

8. The magnetoresistance effect device according to claim 1, wherein the at least one magnetoresistance effect element comprises a plurality of magnetoresistance effect elements, each of the magnetoresistance effect elements is connected to an output signal line through which a high frequency current output from the magnetoresistance effect element flows, the first signal line is disposed at a position at which a high frequency magnetic field is applied to the magnetization free layer of at least one of the magnetoresistance effect elements, and the output signal line is disposed at a position at which a high frequency magnetic field is applied to a magnetization free layer of a magnetoresistance effect element different from the magnetoresistance effect element to which the high frequency magnetic field is applied by the first signal line.

9. A high frequency device using the magnetoresistance effect device according to claim 1.

10. The magnetoresistance effect device according to claim 1, wherein the first signal line is separated from the at least one magnetoresistance effect element.

* * * * *